(12) United States Patent
Kim

(10) Patent No.: US 11,043,805 B2
(45) Date of Patent: Jun. 22, 2021

(54) SEMICONDUCTOR DEVICE AND A SEMICONDUCTOR PACKAGE INCLUDING THE SAME

(71) Applicant: SAMSUNG ELECTRONICS CO., LTD., Suwon-si (KR)

(72) Inventor: Jang Hoo Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 224 days.

(21) Appl. No.: 16/266,211

(22) Filed: Feb. 4, 2019

(65) Prior Publication Data
US 2019/0363535 A1    Nov. 28, 2019

(30) Foreign Application Priority Data

May 24, 2018  (KR) .................. 10-2018-0059015

(51) Int. Cl.
| | |
|---|---|
| *H02H 9/04* | (2006.01) |
| *H01L 27/02* | (2006.01) |
| *H01L 23/525* | (2006.01) |
| *H01L 23/528* | (2006.01) |
| *H01L 25/065* | (2006.01) |

(52) U.S. Cl.
CPC ......... *H02H 9/046* (2013.01); *H01L 23/5252* (2013.01); *H01L 23/5256* (2013.01); *H01L 23/5283* (2013.01); *H01L 25/0655* (2013.01); *H01L 27/0255* (2013.01); *H01L 27/0292* (2013.01); *H01L 27/0296* (2013.01)

(58) Field of Classification Search
CPC .............. H01L 27/0255; H01L 27/096; H01L 27/0292; H01L 9/046; H02H 9/046
See application file for complete search history.

(56) References Cited

U.S. PATENT DOCUMENTS

| | | | | |
|---|---|---|---|---|
| 6,141,245 A | * | 10/2000 | Bertin ................... | G11C 17/16 257/E25.013 |
| 6,327,125 B1 | | 12/2001 | Colclaser et al. | |
| 6,329,863 B1 | * | 12/2001 | Lee ......................... | H01L 23/50 257/E23.079 |
| 7,183,623 B2 | | 2/2007 | Jensen et al. | |
| 7,301,229 B2 | | 11/2007 | Yau | |
| 8,351,170 B2 | | 1/2013 | Dunnihoo et al. | |

(Continued)

FOREIGN PATENT DOCUMENTS

| | | |
|---|---|---|
| KR | 10-2010-0096235 A | 9/2010 |
| WO | WO 2009/076431 | 6/2009 |

*Primary Examiner* — Rafael O De Leon Domenech
(74) *Attorney, Agent, or Firm* — Lee IP Law, PC

(57) ABSTRACT

A semiconductor device includes an internal circuit in a core region, a first protection circuit in a peripheral region surrounding the core region, the first protection circuit including first and second protection sections and a first fuse, and a first pad receiving a first signal. The first pad is electrically connected to the first protection section via the first fuse, and the first pad is electrically connected to the second protection section. The internal circuit is electrically connected to the first pad through the second protection section. When a surge voltage having a magnitude equal to or larger than a predetermined voltage is input to the first pad, each of the first and second protection sections prevent the surge voltage from being applied into the internal circuit.

19 Claims, 13 Drawing Sheets

(56) References Cited

U.S. PATENT DOCUMENTS

| | | | |
|---|---|---|---|
| 9,355,971 B1* | 5/2016 | Mallikarjunaswamy | ..................... H01L 23/5256 |
| 2001/0017755 A1* | 8/2001 | Toyoshima | ......... H01L 27/0255 361/56 |
| 2003/0013258 A1* | 1/2003 | Lee | ................... H01L 21/67353 438/298 |
| 2004/0141269 A1* | 7/2004 | Kitagawa | ............ H01L 27/0251 361/56 |
| 2004/0190208 A1* | 9/2004 | Levit | ....................... H01L 23/60 361/56 |
| 2005/0088794 A1* | 4/2005 | Boerstler | ............... H02H 9/046 361/103 |
| 2005/0224883 A1 | 10/2005 | Huang et al. | |
| 2007/0057346 A1* | 3/2007 | Lee | ..................... H01L 27/0288 257/546 |
| 2008/0128690 A1 | 6/2008 | Burnside et al. | |
| 2009/0020844 A1* | 1/2009 | Park | .................... H01L 27/0255 257/476 |
| 2010/0127359 A1 | 5/2010 | Bazarjani et al. | |
| 2010/0134938 A1 | 6/2010 | Fukuda | |
| 2015/0069577 A1 | 3/2015 | Hart et al. | |
| 2017/0194317 A1* | 7/2017 | Wallis | ..................... H01L 24/32 |
| 2017/0338219 A1* | 11/2017 | Choi | ................... H01L 23/5286 |

* cited by examiner

US 11,043,805 B2

SEMICONDUCTOR DEVICE AND A SEMICONDUCTOR PACKAGE INCLUDING THE SAME

CROSS-REFERENCE TO RELATED APPLICATION

Korean Patent Application No. 10-2018-0059015, filed on May 24, 2018, in the Korean Intellectual Property Office, and entitled: "Semiconductor Device and Semiconductor Package Including the Same," is incorporated by reference herein in its entirety.

BACKGROUND

1. Field

Embodiments relate to a semiconductor device and a semiconductor package including the same.

2. Description of the Related Art

A voltage with a very high instantaneous voltage may be applied to the semiconductor device by static electricity. Under such circumstances, when destruction of a gate insulating layer of a MOS (Metal Oxide Semiconductor) transistor device in the semiconductor device, junction spiking, or the like, occurs, the device may be minutely damaged or completely destroyed, which has a serious effect on the reliability of the semiconductor device. Accordingly, efforts have directed to prevention of such damage in the development stage of semiconductor devices.

SUMMARY

Embodiments are directed to a semiconductor device, including an internal circuit in a core region, a first protection circuit in a peripheral region surrounding the core region, the first protection circuit including first and second protection sections and a first fuse, and a first pad receiving a first signal. The first pad is electrically connected to the first protection section via the first fuse, and the first pad is electrically connected to the second protection section. The internal circuit is electrically connected to the first pad through the second protection section. When a surge voltage having a magnitude equal to or larger than a predetermined voltage is input to the first pad, each of the first and second protection sections prevent the surge voltage from being applied into the internal circuit.

Embodiments are also directed to a semiconductor package including a first semiconductor device that includes a first pad receiving a first signal, a first protection section electrically connected to the first pad through a first fuse, a second protection section connected to the first pad, a second pad electrically connected to the first protection section, and a first internal circuit electrically connected to the first pad through the first protection section, a circuit board on which the first semiconductor device is mounted, a first input/output pad on the circuit board and electrically connected to the first pad, and a probing pad on the circuit board and electrically connected to the second pad. The first fuse is electrically insulated when a melting current equal to or greater than a predetermined current is input between the first input/output pad and the probing pad.

Embodiments are also directed to a semiconductor device including a first fuse connected to a first node and a second node, a first pad, which is electrically connected to the second node and a third node and to which a first signal is input from the outside, a first diode, which has an anode electrically connected to the first node, and a cathode electrically connected to a first voltage line to which a first voltage is applied, a second diode, which has a cathode electrically connected to the first node, and an anode electrically connected to a second voltage line to which a second voltage different from the first voltage is applied, a third diode, which has an anode electrically connected to the third node, and a cathode electrically connected to the first voltage line, a fourth diode, which has a cathode electrically connected to the third node, and an anode electrically connected to the second voltage line, a fusing diode having an anode electrically connected to the first node, and a second pad electrically connected to a cathode of the fusing diode by the first connection line. A width of the first connection line is greater than a width of the first fuse.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
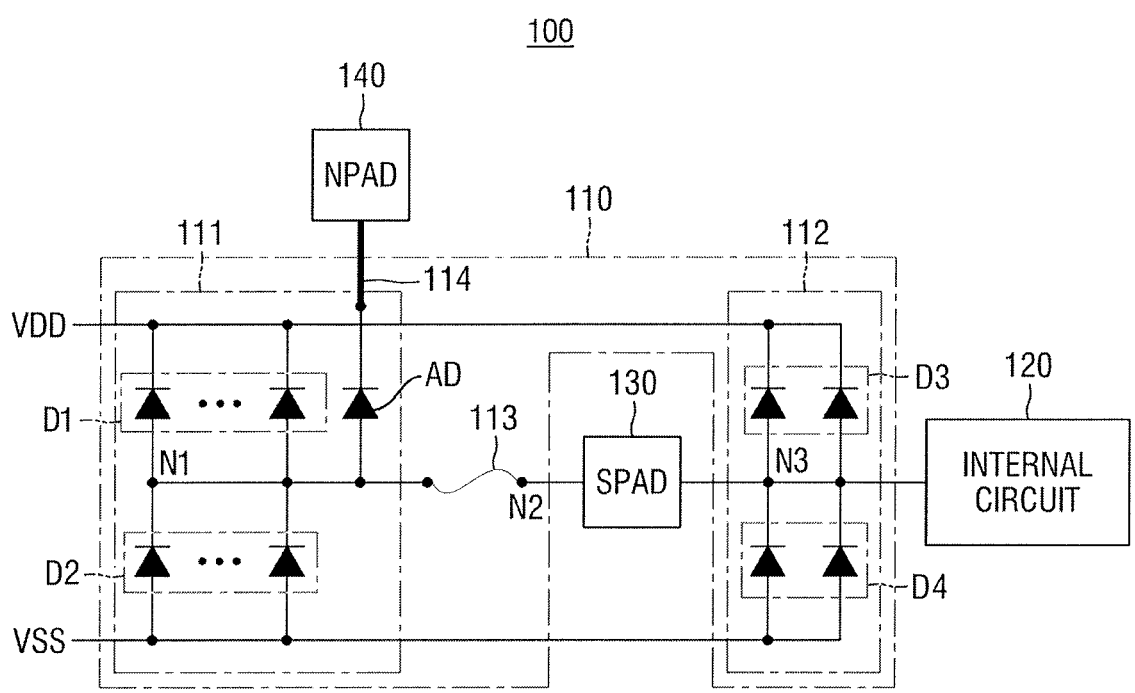
FIG. 1 illustrates a diagram of an electric static discharge (ESD) protection circuit according to some embodiments.

FIG. 1 illustrates an diagram of an electric static discharge (ESD) protection circuit according to an embodiment.

An electric static discharge protection circuit 100 according to an embodiment may include a protection circuit 110, an internal circuit 120, a signal bonding pad (SPAD) 130, and an NC bonding pad 140.

In some embodiments, a surge voltage having an absolute value greater than a predetermined voltage may be input to a semiconductor device (510 of FIG. 5) or a semiconductor package 700, depending on specific external circumstances. For example, the surge voltage may be generated by static electricity. In some embodiments, the surge voltage may be generated by a human body, or may be generated by charged object, or the like. When a surge voltage is input from the outside, a general semiconductor device may be very sensitively affected. When the current generated by the surge voltage flows into the internal circuit 120, the flowing-in current may destroy an insulating layer, a channel or the like formed in the internal circuit 120 to destroy the internal circuit 120 itself. The protection circuit 110 according to some embodiments may help to prevent damage to the internal circuit 120, when the surge voltage is input to the semiconductor device (510 of FIG. 5) or the semiconductor package (700 of FIG. 7). In order to perform the function, the protection circuit 110 according to some embodiments may include a first protection section 111, a second protection section 112, and a fuse 113.

The first protection section 111 may include a plurality of diodes. In some embodiments, the first protection section 111 may include a plurality of first diodes D1 having a cathode electrically connected to a first voltage line (VDD) and an anode electrically connected to a first node N1. The first protection section 111 may further include a plurality of second diodes D2 having a cathode electrically connected to the first node N1 and an anode electrically connected to the second voltage line VSS. The first voltage line (VDD) may be a line to which a first voltage is applied. The second voltage line VSS may be a line to which a second voltage is applied. In some embodiments, the first voltage may be greater than the second voltage. The first protection section 111 may further include a fusing diode AD electrically connected to the NC bonding pad 140 via a first connection line 114. The fusing diode AD may have an anode connected to the first node N1 and a cathode connected to the NC bonding pad 140 via the first connection line 114. When the surge voltage is input to the semiconductor device (510 of FIG. 5) or the semiconductor package (700 of FIG. 7) according to some embodiments, the first diode D1 and the second diode D2 may form a first current path to prevent damage to the internal circuit 120. A specific explanation thereof will be given below.

The second protection section 112 may include a plurality of diodes. In some embodiments, the second protection section 112 may include a third diode D3 having a cathode electrically connected to the first voltage line (VDD), and an anode electrically connected to the third node N3. The second protection section 112 may further include a fourth diode D4 having a cathode electrically connected to the third node N3, and an anode electrically connected to the second voltage line VSS. Although FIG. 1 illustrates two diodes included in the third diode D3 and two diodes included in the fourth diode D4, in some implementations, the third diode D3 may include a single diode and the fourth diode D4 may include a single diode. Functions described in several embodiments may be implemented in various ways. When the surge voltage is input to the semiconductor device (510 of FIG. 5) or the semiconductor package (700 of FIG. 7) according to some embodiments, the third diode D3 and the fourth diode D4 may form a second current path to prevent damage to the internal circuit 120. A specific explanation thereof will be given below.

In some embodiments, the number of diodes included in the first protection section 111 may be greater than the number of diodes included in the second protection section 112. Generally, a diode through which a current flows may generate heat. For example, when a surge voltage is input to the semiconductor device (510 of FIG. 5) or the semiconductor package (700 of FIG. 7) according to some embodiments, heat generated from the first protection section 111 may be greater than the heat generated in the second protection section 112.

In some embodiments, the first protection section 111 and the second protection section 112 are illustrated as being formed only of diodes. In some implementations, the first protection section 111 and the second protection section 112 may be implemented in various manners to prevent the current due to the surge voltage from flowing into the internal circuit 120. For example, the first protection section 111 and the second protection section 112 may use various electronic elements such as a CMOS transistor, an NMOS transistor, a PMOS transistor, a capacitor, and a resistor.

A fuse 113 may be used to electrically connect the first protection section 111 and the signal bonding pad 130. The fuse 113 may be connected to the first node N1 electrically connected to the first protection section 111 and to the second node N2 electrically connected to the signal bonding pad 130.

The fuse 113 may be electrically insulated by a melting current having a certain size or more. For example, the heat generated when the melting current flows through the fuse 113 may melt the metal component of the fuse 113, thereby making it possible to electrically insulate both ends of the fuse 113. Hereinafter, a metal fuse which electrically insulates both ends of the fuse 113 by physically severing the fuse 113 through the melting current will be described as an example.

The internal circuit 120 may be connected to the signal bonding pad 130 via the second protection section 112. For example, the internal circuit 120 may be connected to the third node N3.

The signal bonding pad 130 may receive an input from the outside or provide an output to the outside. In some embodiments, a surge voltage generated from the outside may be input via the signal bonding pad 130.

The signal bonding pad 130 may be electrically connected to the first protection section 111 via the fuse 113. Further, the signal bonding pad 130 may be electrically connected to the second protection section 112. For example, the signal bonding pad 130 may be connected to the second node N2 and the third node N3.

The NC bonding pad 140 may be electrically connected to the first protection section 111 via the first connection line 114. The first connection line 114 may be connected to the NC bonding pad 140 and the first protection section 111. For example, the first connection line 114 may be connected to the NC bonding pad 140 and the cathode of the fusing diode AD. The NC bonding pad 140 may be an unused ball, pin, or pad of the semiconductor device (500 of FIG. 5). In some embodiments, the NC bond pad 140 may be connected to the NC pad (NC of FIG. 7) in the semiconductor package (700 of FIG. 7). Detailed description thereof will be described below.

In some embodiments, a line width of the first connection line 114 for electrically connecting the NC bonding pad 140 and the first protection section 111 may be larger than the line width of the fuse 113. For example, even if a melting current that electrically insulates the fuse 113 were to flow through the first connection line 114, the first connection line 114 may not be electrically insulated. For example, the resistance of the first connection line 114 may be smaller than the resistance of the fuse 113. Heat generated when the melting current flows through the first connection line 114 may be smaller than the heat generated when the melting current flows through the fuse 113.

In some embodiments, the fusing diode AD may be disposed to be closest to the fuse 113 in the first protection section 111. TA current flowing in when electrically blowing the fuse 113 may be prevented from being transmitted to other constituent elements included in the semiconductor device (510 of FIG. 5) or the semiconductor package (700 of FIG. 7) to destroy its constituent elements. For example, in order to form the shortest melting current path formed when electrically blowing the fuse 113, the first connection line 114 may be connected to the cathode of the fusing diode AD disposed to be closest to the fuse 113. The first connection line 114 may not be connected to the first and second diodes D1 and D2 and may be connected only to the fusing diode AD.

Figure 5:
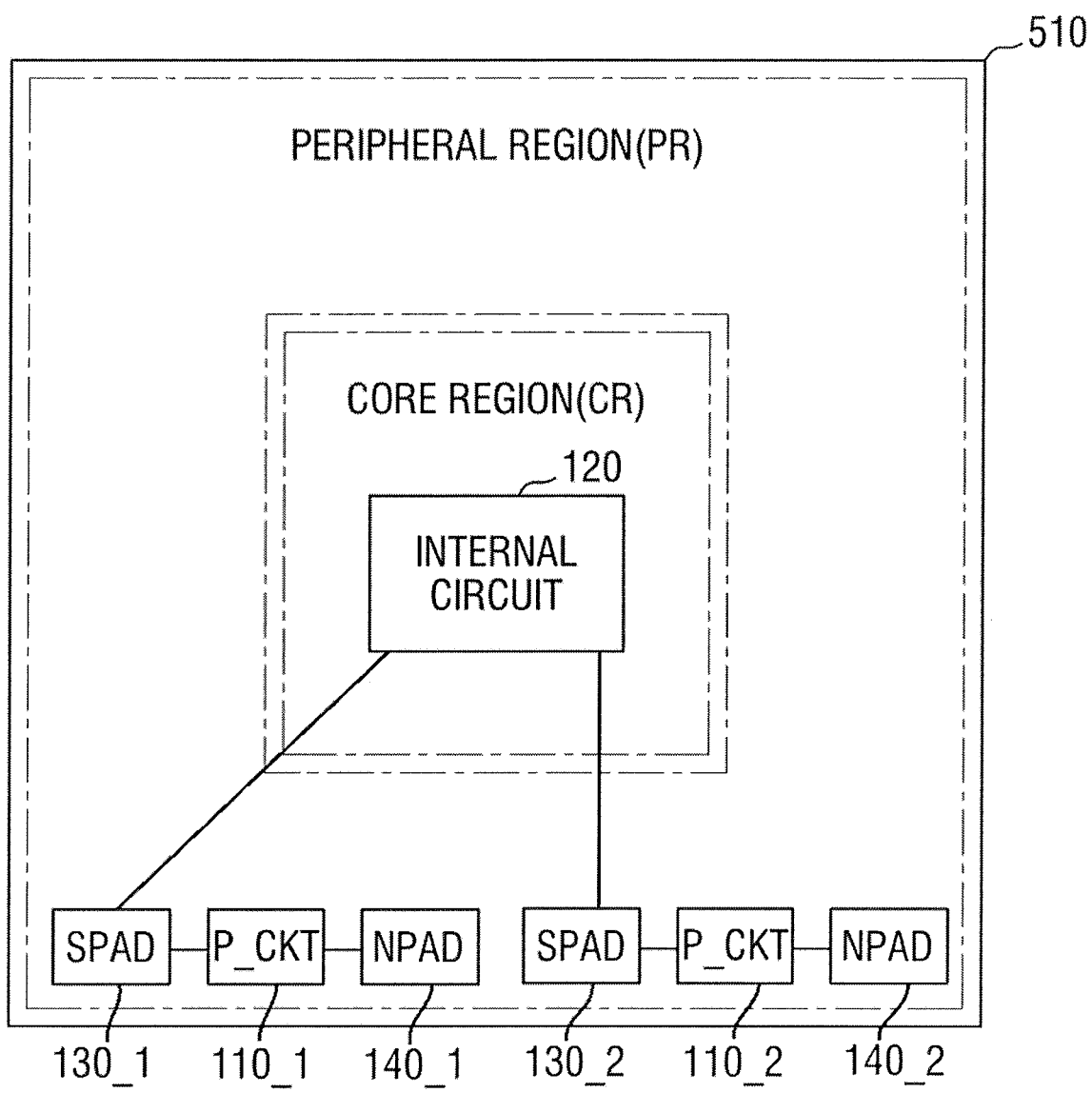
FIG. 5 illustrates an exemplary diagram of the semiconductor device according to some embodiments.

FIG. 1 illustrates a configuration in which one internal circuit 120 includes one signal bonding pad 130. In some implementations, as illustrated in FIG. 5, one internal circuit 120 may include a plurality of signal bonding pads.

Figure 2:
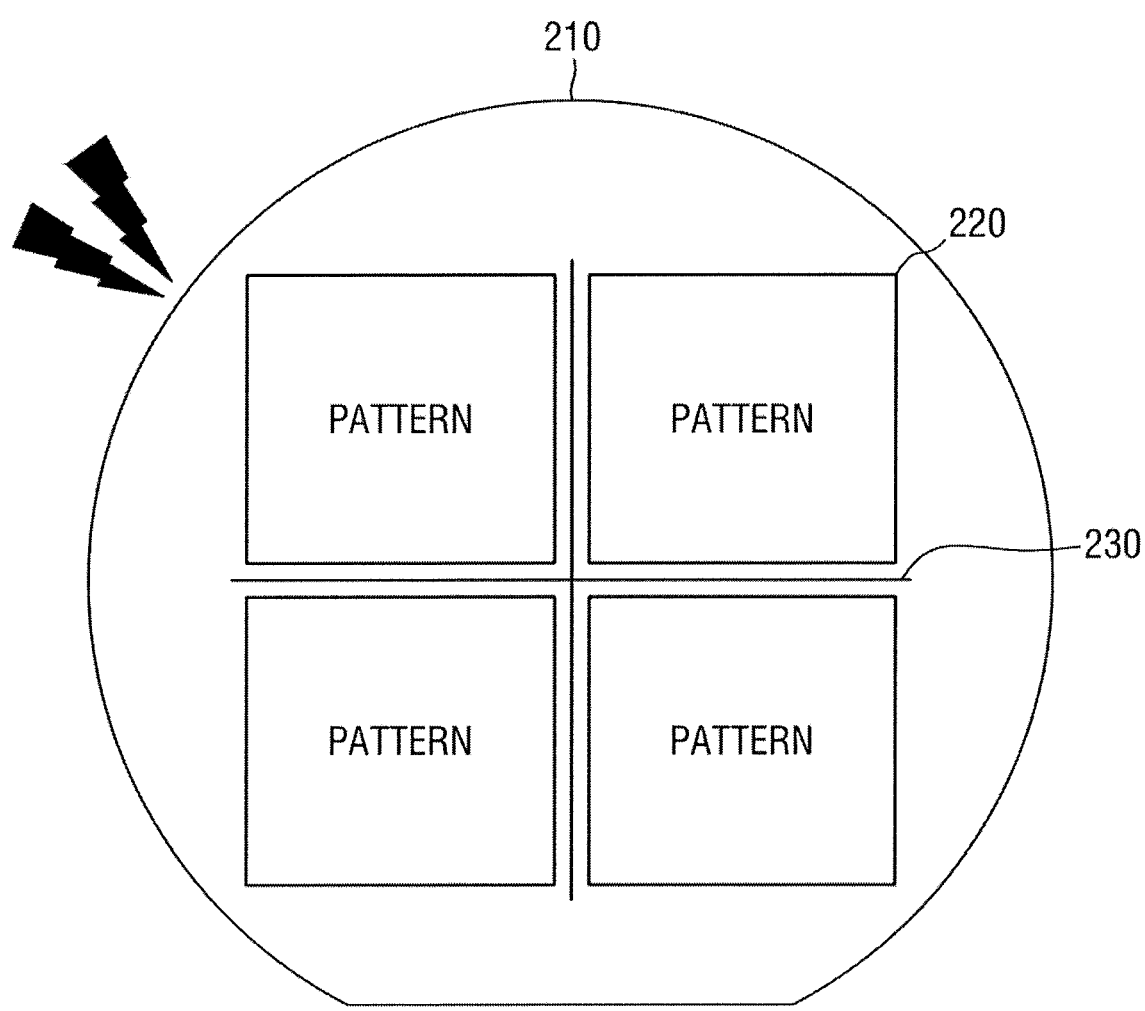
FIG. 2 illustrates an exemplary diagram of a substrate and a semiconductor pattern including an electric static discharge protection circuit according to some embodiments.

FIG. 2 illustrates an exemplary diagram of a substrate and a semiconductor pattern including an electric static discharge protection circuit according to some embodiments.

Referring to FIG. 2, the substrate 210 may include a semiconductor pattern 220 and a scribe lane 230. The semiconductor pattern 220 may include the above-described electric static discharge protection circuit (100 of FIG. 1).

The semiconductor pattern 220 may be formed on the substrate 210, using the manufacturing process of the semiconductor pattern 220. The substrate 210 may be a silicon substrate or may include other materials, for example, silicon germanium, indium antimonide, lead tellurium compounds, indium arsenide, indium phosphide, gallium arsenide or gallium antimonide.

The formed semiconductor pattern 220 may be sawed along the scribe lane 230.

Subsequently, each semiconductor device (510 of FIG. 5) may be provided by a packaging process or the like of each of the sawed semiconductor patterns. In the process of making the semiconductor pattern 220 formed on the substrate 210 into the respective semiconductor devices (510 of FIG. 5), there is a risk that a surge voltage could applied to the inside of the substrate 210 or the semiconductor pattern 220. For example, in the process of transferring the substrate 210 or the sawed semiconductor pattern, there is a risk that a surge voltage could be applied to the inside of the substrate 210 or the semiconductor pattern 220. When the semiconductor pattern 220 includes the above-described electric static discharge protection circuit 100, destruction of the internal circuit 120 due to the surge voltage can be prevented. The first and second current paths P1 and P2 formed by each of the first and second protection sections 111 and 112 included in the protection circuit 110 will be described referring to FIGS. 3 and 4.

Figure 3:
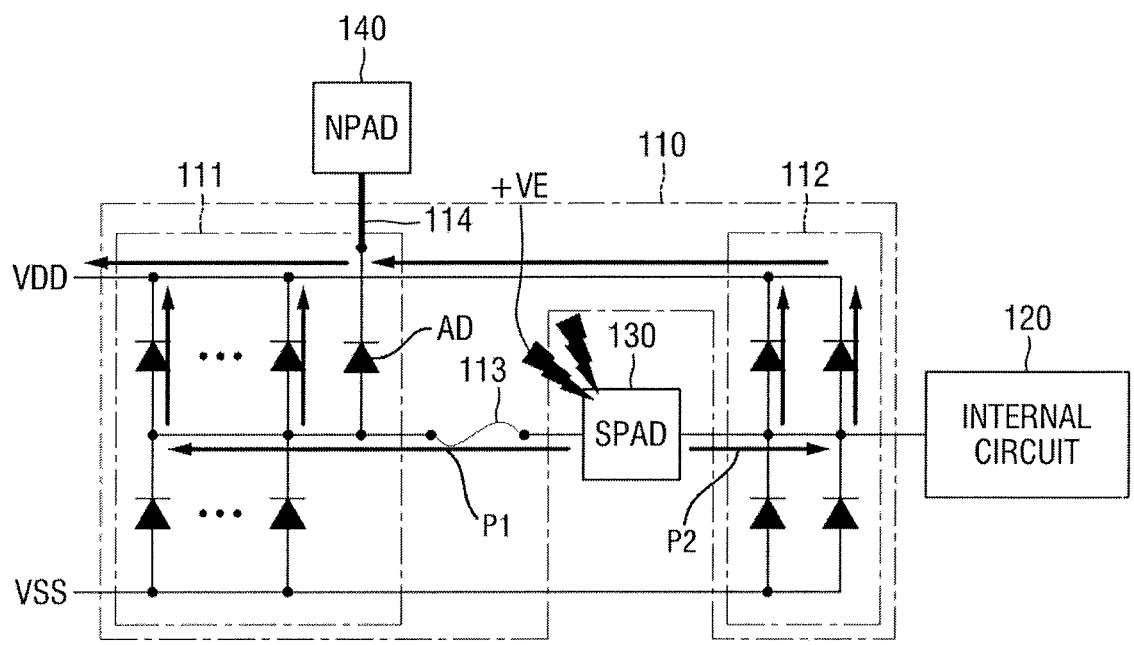
FIG. 3 illustrates an exemplary diagram of first and second current paths formed by each of the first and second protection sections when a positive surge voltage is applied to the substrate and semiconductor pattern according to some embodiments.
Figure 4:
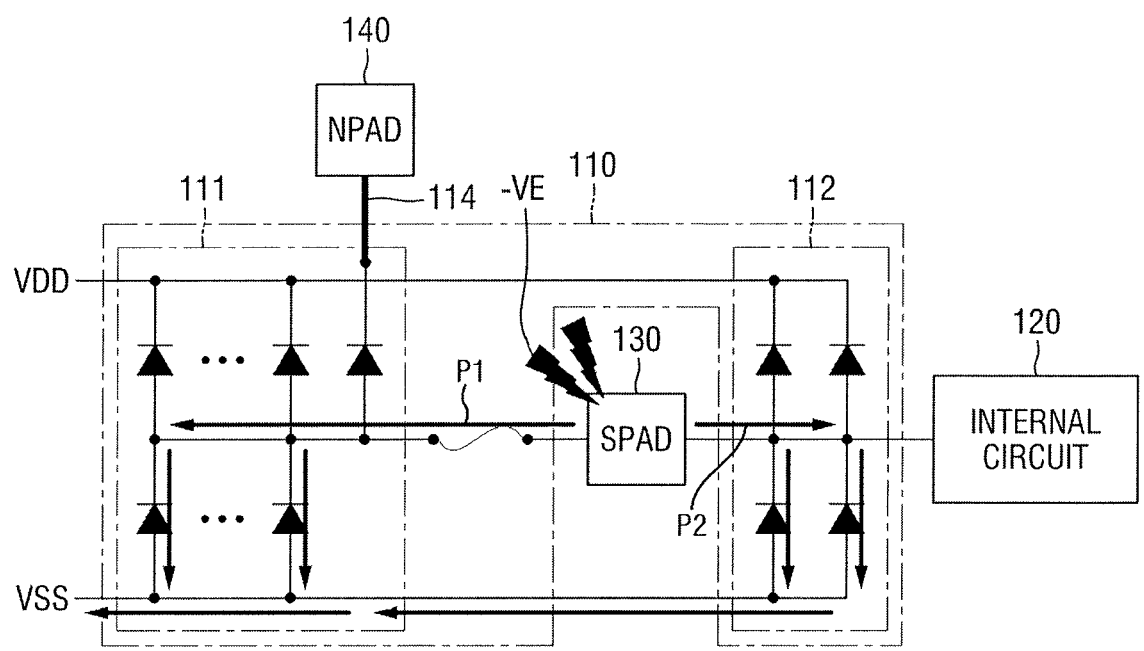
FIG. 4 illustrates an exemplary diagram of first and second current paths formed by each of the first and second protection sections when a negative surge voltage is applied to the substrate and the semiconductor pattern according to some embodiments.

FIG. 3 illustrates an exemplary diagram of first and second current paths formed by each of the first and second protection sections when a positive surge voltage is applied to the substrate and semiconductor pattern according to some embodiments. FIG. 4 illustrates an exemplary diagram of first and second current paths formed by each of the first and second protection sections when a negative surge voltage is applied to the substrate and the semiconductor pattern according to some embodiments.

Referring to FIG. 3, a case where a positive voltage (+VE) equal to or larger than a predetermined value is applied to the signal bonding pad 130 is assumed.

Referring to FIGS. 1 and 3, as described above, the first protection section 111 may include first and second diodes D1 and D2. When the positive surge voltage (+VE) is not applied to the signal bonding pad 130, the first and second diodes D1 and D2 may have a reverse bias. However, when the positive surge voltage (+VE) is applied to the signal bonding pad 130, the first diode D1 may be converted into a forward bias. At this time, the second diode D2 may maintain the reverse bias. Therefore, when the positive surge voltage (+VE) is applied to the signal bonding pad 130, a first current path P1 directed from the signal bonding pad 130 to the first voltage line (VDD) via the first diode D1 may be formed.

The second protection section 112 may include third and fourth diodes D3 and D4. As in the case of the first and second diodes D1 and D2, when the positive surge voltage (+VE) is not applied to the signal bonding pad 130, the third and fourth diodes D3 and D4 may be reverse bias. However, when the positive surge voltage (+VE) is applied to the signal bonding pad 130, the third diode D3 may be converted into a forward bias. The fourth diode D4 may maintain the reverse bias. Therefore, when the positive surge voltage (+VE) is applied to the signal bonding pad 130, a second current path P2 directed from the signal bonding pad 130 to the first voltage line (VDD) via the third diode D3 may be formed.

Referring to FIG. 4, a case where a negative surge voltage (−VE) less than a predetermined value is applied to the signal bonding pad 130 will be assumed.

Referring to FIGS. 1 and 4, when the negative surge voltage (−VE) is not applied to the signal bonding pad 130, the first and second diodes D1 and D2 may have a reverse bias. However, when the negative surge voltage (−VE) is applied to the signal bonding pad 130, the second diode D2 may be converted into a forward bias. At this time, the first diode D1 may maintain the reverse bias. Therefore, when the negative surge voltage (−VE) is applied to the signal bonding pad 130, the first current path P1 directed from the signal bonding pad 130 to the second voltage line VSS via the second diode D2 may be formed.

The second protection section 112 may include third and fourth diodes D3 and D4. When the negative surge voltage (−VE) is not applied to the signal bonding pad 130 as in the case of the first and second diodes D1 and D2, the third and fourth diodes D3 and D4 may have a reverse bias. However, when the negative surge voltage (−VE) is applied to the signal bonding pad 130, the fourth diode D4 may be converted into the forward bias. At this time, the third diode D3 may maintain the reverse bias. Therefore, when the negative surge voltage (−VE) is applied to the signal bonding pad 130, the second current path P2 directed from the signal bonding pad 130 to the second voltage line VSS via the fourth diode D4 may be formed.

For example, the first and second protection sections 111 and 112 may allow the currents generated by the surge voltages (+VE, −VE) to flow to the first and second voltage lines (VDD, VSS) through the first and second current paths P1 and P2, respectively. Therefore, the current transmitted to the internal circuit 120 may be extremely small, and damage to the internal circuit 120 may be prevented by the first and second protection sections 111 and 112.

In some embodiments, when the surge voltages (+VE, −VE) are applied to the signal bonding pad 130, a current may flow through the first to fourth diodes D1 to D4. When the current flows through the first to fourth diodes D1 to D4, heat may be generated in each of the first to fourth diodes D1 to D4. For the sake of convenience, the total amount of heat generated in the first protection section 111 is defined as a first heat, and the total amount of heat generated in the second protection section 112 is defined as a second heat.

In some embodiments, the number of first and second diodes D1 and D2 included in the first protection section 111 may be greater than the number of diodes included in the third and fourth diode D3 and D4 included in the second protection section 112. In this case, the first heat may be greater than the second heat. Generally, when heat is applied to a diode for a long time, the diode may melt. Therefore, the number of diodes included in the first to fourth diodes D1 to D4 may be set as a design specification in accordance with the time at which the surge voltage is applied. The first protection section 111 may be a protection circuit that prepares for, for example, an HBM (Human Body Model) when the surge voltages (+VE, −VE) are applied for a relatively long time. In some implementations, the first protection section 111 may form the first current path P1, which protects the internal circuit 120 even when the surge voltages (+VE, −VE) are applied for a relatively short time.

FIG. 5 illustrates an exemplary diagram of a semiconductor device according to some embodiments. For the sake of convenience of explanation, contents redundant or similar to those described above will be briefly explained or will not be repeated.

Referring to FIG. 5, the semiconductor device 510 according to some embodiments may include a core region (CR) and a peripheral region (PR). For clear distinction between the core region (CR) and the peripheral region (PR), FIG. 5 illustrates a configuration in which the two regions are separated from each other The semiconductor device 510 according to some embodiments may include first and second signal bonding pads 130_1 and 130_2, and first and second protection circuits 110_1 and 110_2 and first and second NC bonding pads 140_1 and 140_2 connected thereto. In some implementations, the semiconductor device 510 may include one or two or three or more signal bonding pads, protection circuits and NC bonding pads. In some implementations, unlike the configuration illustrated in FIG. 5, the first NC bonding pad 140_1 and the second NC bonding pad 140_2 may be the same NC bonding pad.

As described above, the semiconductor device 510 according to some embodiments may be formed by sawing the semiconductor pattern (220 of FIG. 2) along the scribe lane (230 of FIG. 2) and executing a packaging process or the like.

In some embodiments, the internal circuit 120 may be located in the core region (CR) of the semiconductor device 510. The first and second signal bonding pads 130_1 and 130_2, the first and second protection circuits 110_1 and 110_2, and the first and second NC bonding pads 140_1 and 140_2 may be disposed in the peripheral region (PR) of the semiconductor device 510. The internal structure of the semiconductor device 510 according to some embodiments will be described in more detail referring to FIG. 6.

Figure 6:
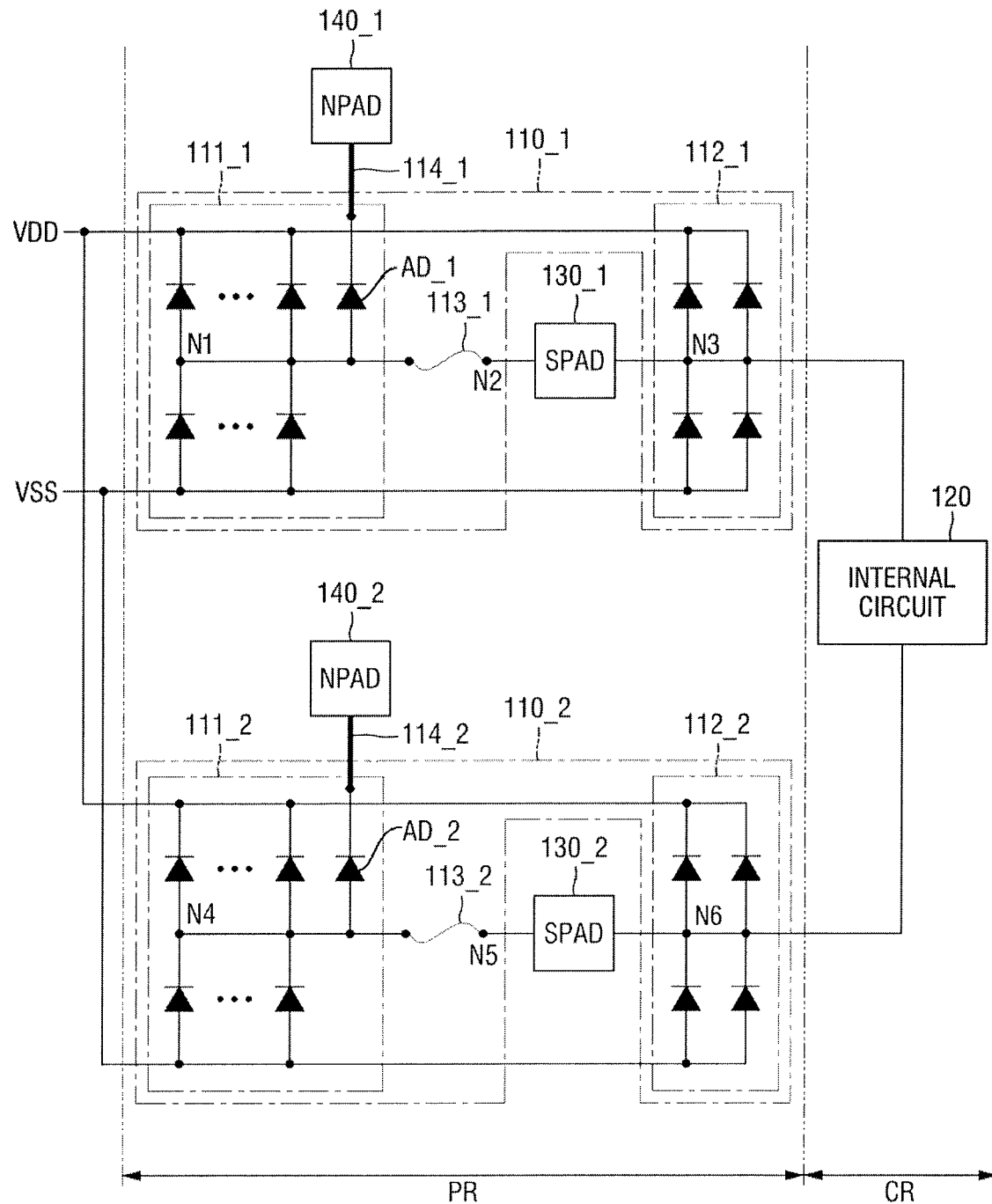
FIG. 6 illustrates an exemplary diagram for explaining the internal configuration of the semiconductor device according to some embodiments.

FIG. 6 illustrates an exemplary diagram for explaining the internal configuration of the semiconductor device according to some embodiments. For convenience of explanation, the same or similar contents as those described above will not be repeated or will be briefly explained.

Referring to FIGS. 5 and 6, in some embodiments, the first signal bonding pad 130_1 may be electrically connected to the first protection section 111_1 through the first fuse 113_1. The first signal bonding pad 130_1 may be electrically connected to the internal circuit 120 through the second protection section 112_1. The first NC bonding pad 140_1 may be electrically connected to the first protection section 111_1 by the first connection line 114_1. The first connection line 114_1 may be connected to the cathode of the first fusing diode AD_1, which is disposed to be closest to the first fuse 113_1 among the diodes included in the first protection section 111_1.

The second signal bonding pad 130_2 may be electrically connected to the third protection section 111_2 via the second fuse 113_2. The second signal bonding pad 130_2 may be connected to the internal circuit 120 via the fourth protection section 112_2. The second NC bonding pad 140_2 may be connected to the third protection section 111_2 by the second connection line 114_2. The second connection line 114_2 may be connected to the cathode of the second fusing diode AD_2, which is disposed to be closest to the second fuse 113_2 among the diodes included in the third protection section 1112.

FIG. 6 illustrates a configuration in which the first and second NC bonding pads 140_1 and 140_2 are separated from each other. In some implementations, the first and second NC bonding pads 140_1 and 140_2 may be the same constituent elements.

In some embodiments, different signals may be input/output to and from the first signal bonding pad 130_1 and the second signal bonding pad 130_2. For example, the first input/output of the internal circuit 120 may be provided to the first signal bonding pad 130_1, and the second input/output of the internal circuit 120 may be provided to the second signal bonding pad 130_2.

As illustrated in FIG. 6, the first and second signal bonding pads 130_1 and 130_2 to which different inputs/outputs are provided may be connected to different protection circuits 110_1 and 110_2, respectively. For example, the first protection circuit 110_1 may be connected to the first signal bonding pad 130_1. The second protection circuit 110_2, different from the first protection circuit 110_1, may be connected to the second signal bonding pad 130_2. The first and second signal bonding pads 130_1 and 130_2 may provide the different inputs/outputs of the internal circuit 120, respectively.

In some embodiments, when a surge voltage is applied to the first signal bonding pad 130_1, the first protection circuit 110_1 may prevent the current generated by the surge voltage from flowing into the internal circuit 120. Further, when the surge voltage is applied to the second signal bonding pad 130_2, the second protection circuit 110_2 may prevent the current generated by the surge voltage from flowing into the internal circuit 120. Therefore, the semiconductor device 510 according to some embodiments may protect the internal circuit 120 even when a surge voltage is generated under a specific situation and applied to the first and second signal bonding pads 130_1 and 130_2. Examples of such a surge voltage may be a surge voltage that is generated when transferring the semiconductor device 510 or a surge voltage that is generated when mounting the semiconductor device 510 onto a package substrate (710 of FIG. 7).

Figure 7:
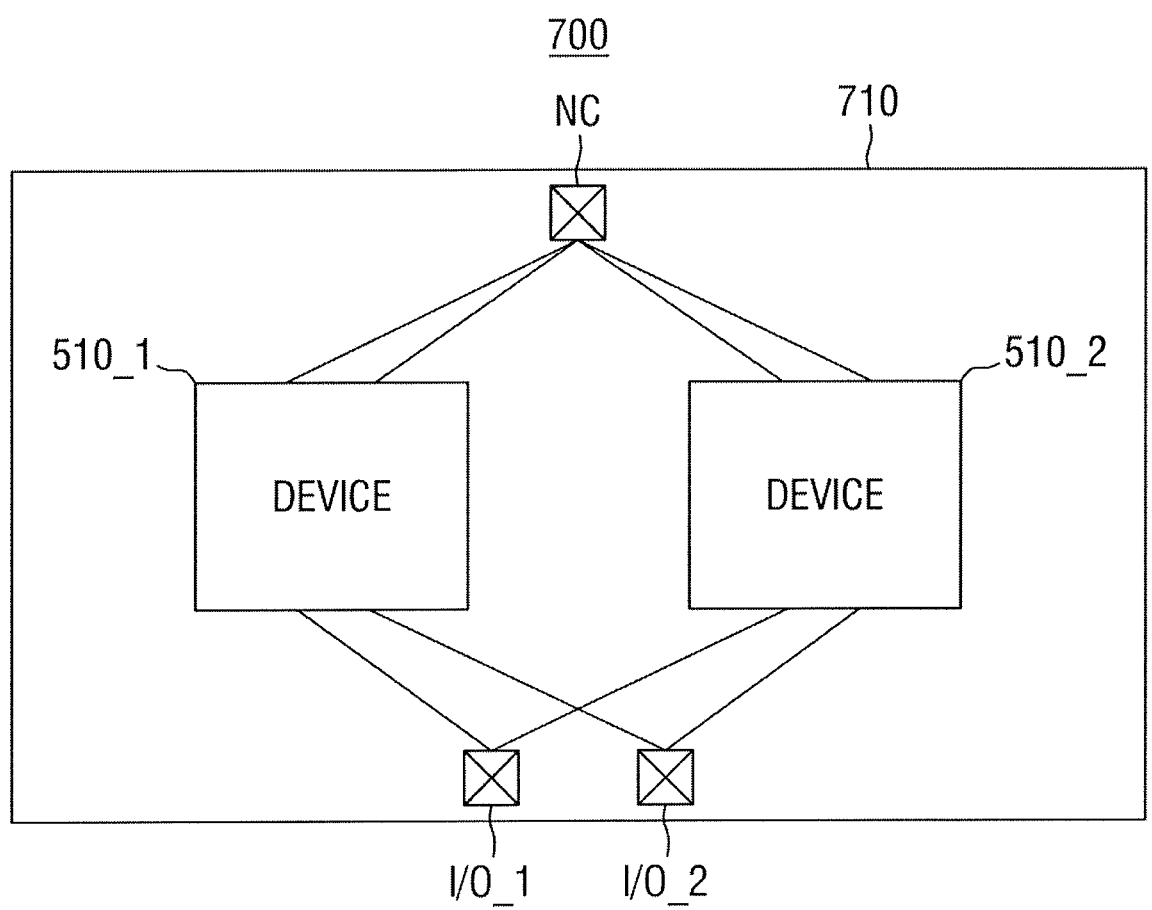
FIG. 7 illustrates an exemplary diagram for illustrating the semiconductor package according to some embodiments.

FIG. 7 illustrates an exemplary diagram of a semiconductor package according to some embodiments. Referring to FIG. 7, the semiconductor package 700 according to some embodiments may include first and second semiconductor devices 510_1 and 510_2, first and second input/output pads I/O_1 and I/O_2, and an NC pad (NC). Each of the first and second semiconductor devices 510_1 and 510_2 may include the above-described electrostatic discharge protection circuit (100 of FIG. 1).

In some embodiments, the first and second semiconductor devices 510_1 and 510_2 may be mounted on the package substrate 710. FIG. 7 illustrates a configuration in which each of the first and second semiconductor devices 510_1 and 510_2 has two inputs/outputs, as an example. Further, FIG. 7 illustrates the configuration in which the two semiconductor devices 510_1 and 510_2 are mounted on the package substrate 710, as an example. For a detailed explanation, reference is made to FIG. 8.

Figure 8:
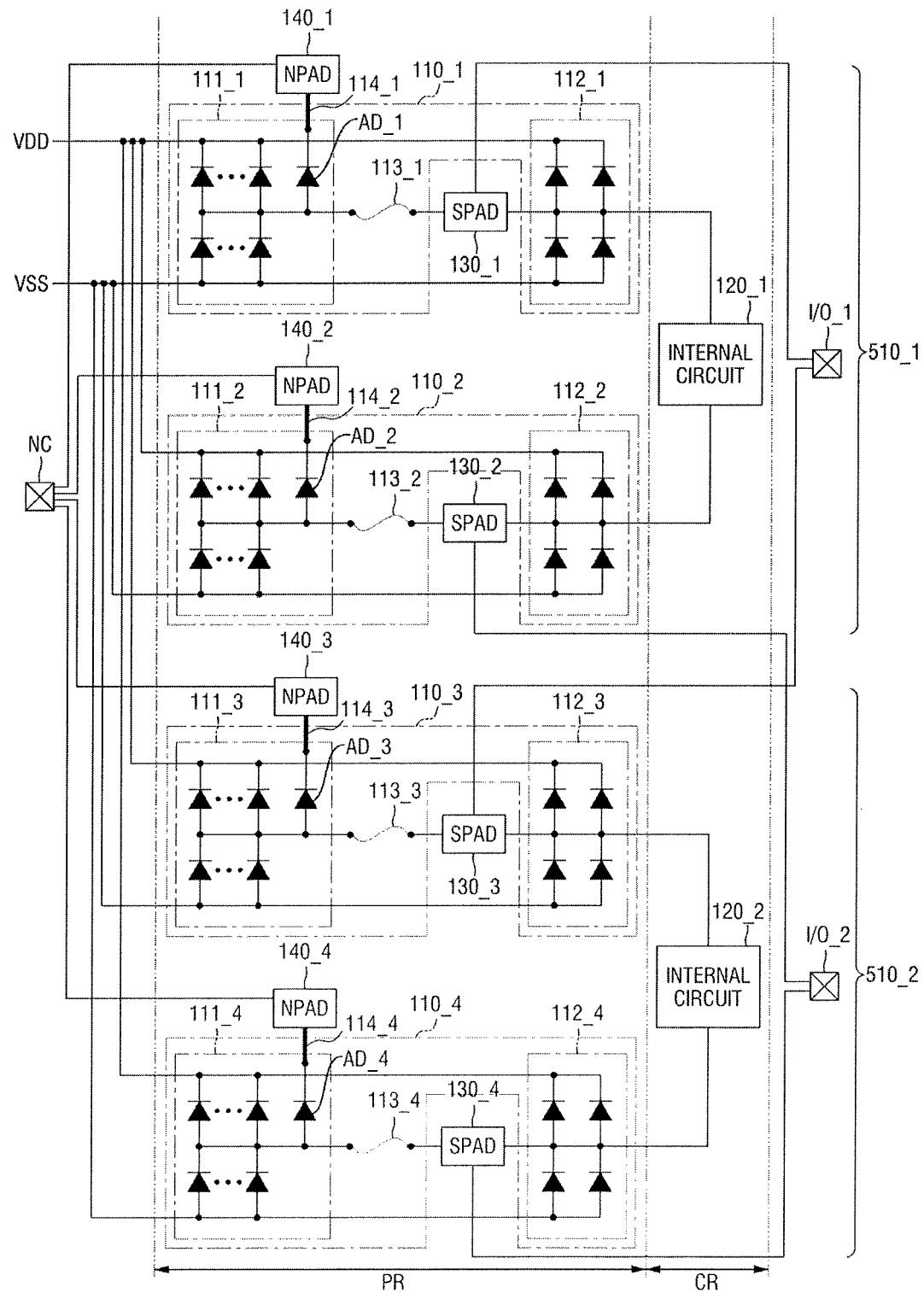
FIG. 8 illustrates an exemplary diagram for explaining a configuration of the semiconductor package according to some embodiments.

FIG. 8 illustrates an exemplary diagram for explaining a configuration of the semiconductor package according to some embodiments. For the sake of convenience of explanation, repeated or similar contents will be not be repeated or will be briefly explained.

In some embodiments, the first semiconductor device 510_1 may include first and second protection circuits 110_1 and 110_2, a first internal circuit 120_1, first and second signal bonding pads 130_1 and 130_2, and first and second NC bonding pads 140_1 and 140_2.

The first protection circuit 110_1 may include a first protection section 111_1, a second protection section 112_1, and a first fuse 113_1. Further, the second protection circuit 110_2 may include a third protection section 111_2, a fourth protection section 112_2, and a second fuse 113_2.

The first signal bonding pad 130_1 may be electrically connected to the first protection section 111_1 via the first fuse 113_1. The first signal bonding pad 130_1 may be electrically connected to the first internal circuit 120_1 via the second protection section 112_1. The first NC bonding pad 140_1 may be electrically connected to the first protection section 111_1 by the first connection line 114_1. The first connection line 114_1 may be connected to the cathode of the first fusing diode AD_1, which is disposed to be closest to the first fuse 113_1 among the diodes included in the first protection section 111_1. For example, the first NC bonding pad 140_1 may be connected to the cathode of the first fusing diode AD_1 by the first connection line 114_1.

The second signal bonding pad 130_2 may be electrically connected to the third protection section 111_2 via the second fuse 113_2. The second signal bonding pad 130_2 may be electrically connected to the first internal circuit 120_1 via the fourth protection section 112_2. The second NC bonding pad 140_2 may be electrically connected to the third protection section 111_2 by the second connection line 114_2. The second connection line 114_2 may be connected to the cathode of the second fusing diode AD_2, which is disposed to be closest to the second fuse 113_2 among the diodes included in the third protection section 111_2. For example, the second NC bonding pad 140_2 may be connected to the cathode of the second fusing diode AD_2 by the second connection line 114_2.

In some embodiments, the second semiconductor device 510_2 may include third and fourth protection circuits 110_3 and 110_4, a second internal circuit 120_2, third and fourth signal bonding pads 130_3 and 130_4, and third and fourth NC bonding pads 140_3 and 140_4.

The third protection circuit 110_3 may include a fifth protection section 111_3, a sixth protection section 112_3, and a third fuse 113_3. The fourth protection circuit 110_4 may include a seventh protection section 111_4, an eighth protection section 112_4, and a fourth fuse 113_4.

The third signal bonding pad 130_3 may be electrically connected to the fifth protection section 111_3 via the third fuse 113_3. The third signal bonding pad 130_3 may be electrically connected to the second internal circuit 120_2 through the sixth protection section 112_3. The third NC bonding pad 140_3 may be electrically connected to the fifth protection section 111_3 by the third connection line 114_3. The third connection line 114_3 may be connected to the cathode of the third fusing diode AD_3, which is disposed to be closest to the third fuse 113_3 among the diodes included in the fifth protection section 111_3. The third NC bonding pad 140_3 may be connected to the cathode of the third fusing diode AD_3 by the third connection line 114_3.

The fourth signal bonding pad 130_4 may be electrically connected to the seventh protection section 111_4 via the fourth fuse 113_4. The fourth signal bonding pad 130_4 may be electrically connected to the second internal circuit 120_2 via the eighth protection section 112_4. The fourth NC bonding pad 140_4 may be electrically connected to the seventh protection section 111_4 by the fourth connection line 114_4. The fourth connection line 114_4 may be connected to the cathode of the fourth fusing diode AD_4, which is disposed to be closest to the fourth fuse 113_4 among the diodes included in the seventh protection section 111_4. For example, the fourth NC bonding pad 140_4 may be connected to the cathode of the fourth fusing diode AD_4 by the fourth connection line 114_4.

In some embodiments, all the first to fourth NC bonding pads 140_1 through 140_4 may be electrically connected to the NC pad (NC). The NC pad (NC) may be, for example, a probing pad for probing the melting current when electrically insulating the first to fourth fuses 113_1 to 113_4 thereafter.

In some embodiments, the first and third signal bonding pads 130_1 and 130_3 may be electrically connected to the first input/output pad I/O_1. The second and fourth signal bonding pads 130_2 and 130_4 may be electrically connected to the second input/output pad I/O_2. Therefore, the first protection section 111_1, the second protection section 112_1, the fifth protection section 111_3, and the sixth protection section 112_3 may all be connected to the first input/output pad I/O_1. Further, the third protection section 111_2, the fourth protection section 112_2, the seventh protection section 111_4, and the eighth protection section 112_4 may all be connected to the second input/output pad I/O_2.

In some embodiments, when the first protection section 111_1, the second protection section 112_1, the fifth protection section 111_3, and the sixth protection section 112_3 are connected to the first input/output pad I/O_1, the first input/output pad I/O_1 may have high input capacitance. When the third protection section 111_2, the fourth protection section 112_2, the seventh protection section 111_4, and the eighth protection section 112_4 are electrically connected to the second input/output pad I/O_2, the second input/output pad I/O_2 may have high input/output capacitance. When the input/output capacitance is high, the operating speed of the semiconductor package 700 may become slow. In order to address this issue, the first to fourth fuses 113_1 to 113_4 of the semiconductor package 700 may be severed to reduce the input/output capacitance of the first and second input/output pads I/O_1 and I/O_2. This will be described in detail with reference to FIGS. 9 and 10.

Figure 9:
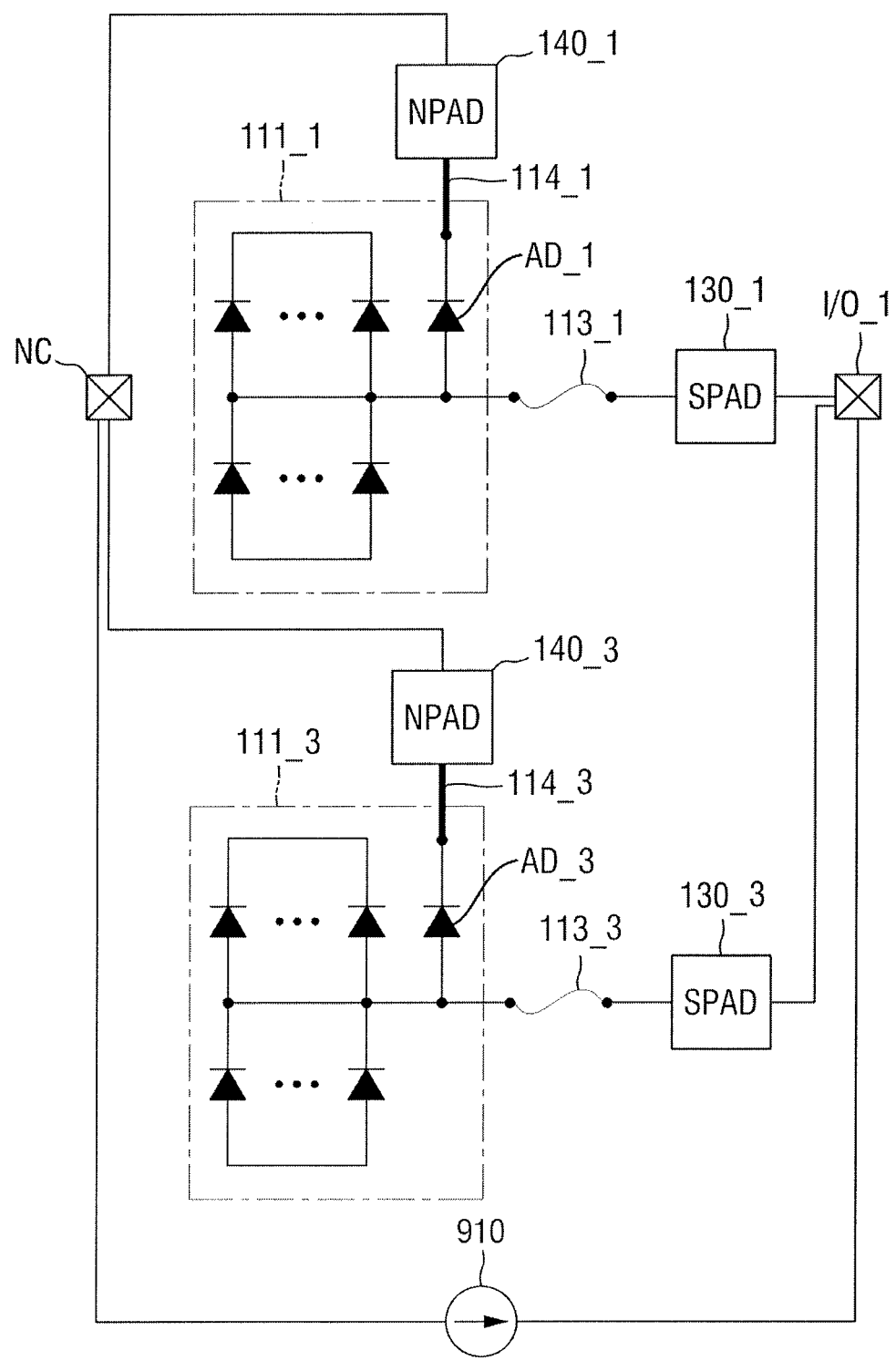
FIG. 9 illustrates an exemplary diagram of stages of a process of severing the fuse according to some embodiments.
Figure 10:
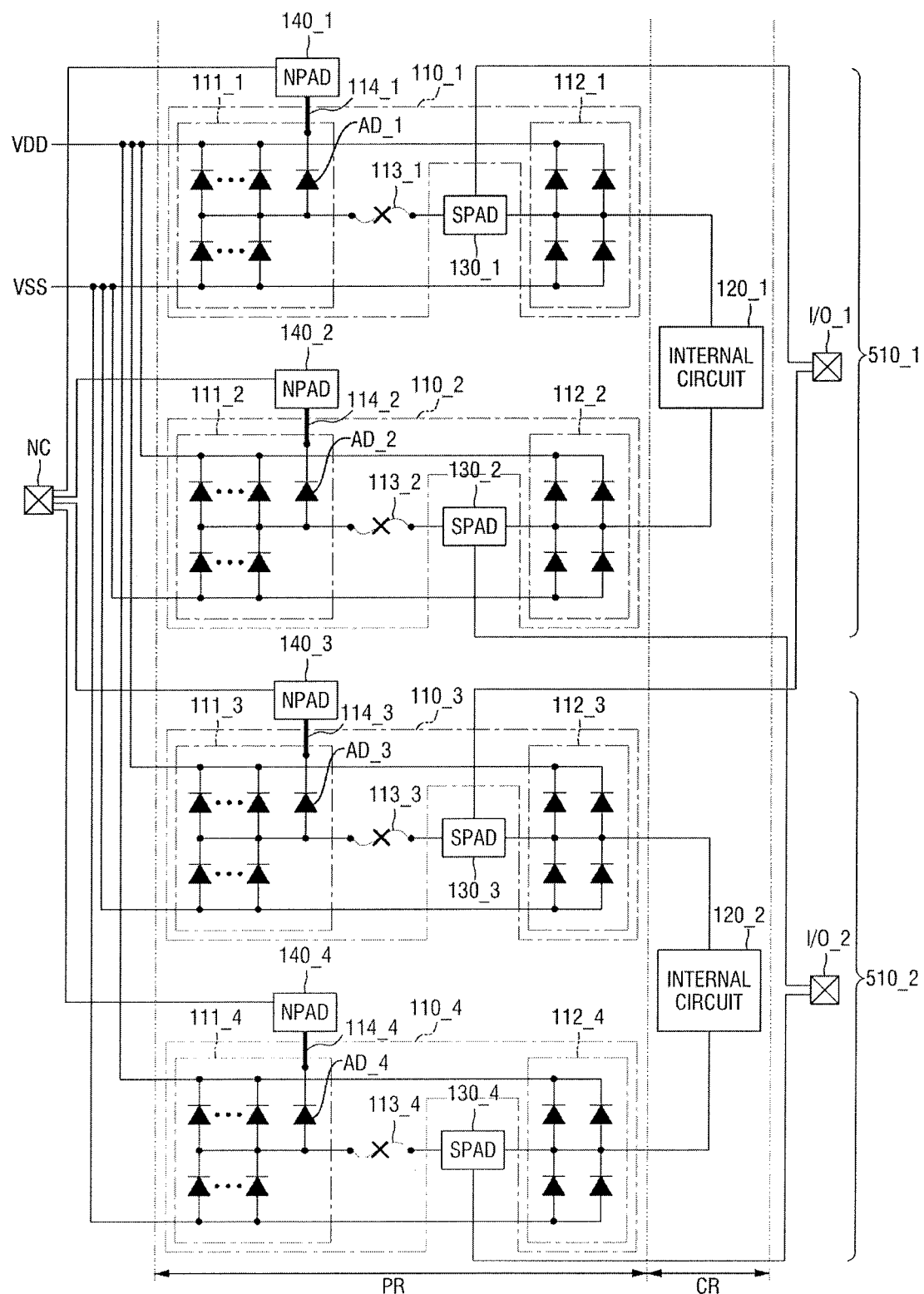
FIG. 10 illustrates an exemplary diagram of a semiconductor package according to some embodiments.

FIG. 9 illustrates an exemplary diagram showing a process of severing the fuse according to some embodiments. FIG. 10 illustrates an exemplary diagram of a semiconductor package according to some embodiments.

Referring to FIGS. 9 and 10, in order to sever the first and third fuses 113_1 and 113_3, a current source 910 may be connected to the first input/output pad I/O_1 and the NC pad (NC). The current source 910 may provide a melting current of a predetermined level to the NC pad (NC) from the first input/output pad I/O_1. The melting current may be provided to the first signal bonding pad 130_1 from the first input/output pad I/O_1. The melting current may also be provided to the third signal bonding pad 130_3 from the first input/output pad I/O_1.

The melting current provided to the first signal bonding pad 130_1 may be provided to the NC pad (NC) via the first fuse 113_1, the first fusing diode AD_1 and the first NC bonding pad 140_1. At this time, the first fuse 113_1 may be severed by the melting current provided to the first signal bonding pad 130_1. When the first NC bonding pad 140_1 is connected only to the cathode of the first fusing diode AD_1, it may be possible to prevent the melting current from flowing to other constituent elements included in the semiconductor package 700, such as the first voltage line (VDD).

Similarly, the melting current provided to the third signal bonding pad 130_3 may be provided to the NC pad (NC) via the third fuse 113_3, the third fusing diode AD_3 and the third NC bonding pad 140_3. The third fuse 113_3 may be severed by the melting current provided to the third signal bonding pad 130_3. When the third NC bonding pad 140_3 is connected only to the cathode of the third fusing diode AD_3, it may be possible to prevent the melting current from flowing to other constituent elements included in the semiconductor package 700, such as the first voltage line (VDD).

In some embodiments, when providing the melting current to the first input/output pad I/O_1 and the NC pad (NC), the first and third fuses 113_1 and 113_3 may be simultaneously blown. At this time, when the first and third NC bonding pads 140_1 and 140_3 are connected only to the first and third fusing diodes AD_1 and AD_3, respectively, it may be possible to prevent the melting current from flowing through other constituent elements included in the semiconductor package 700, such as the first voltage line (VDD). Further, when the first and third fusing diodes AD_1 and AD_3 are disposed to be closest to the first and third fuses 113_1 and 113_3 in the first protection section 111, it may be possible to prevent the melting current from flowing through other constituent elements included in the semiconductor package 700, such as the first voltage line (VDD).

Similarly, the current source 910 may be connected to the second input/output pad I/O_2 and the NC pad (NC) so as to sever the second and fourth fuses 113_2 and 113_4. The second and fourth fuses 113_2 and 113_4 may be severed by the melting current provided to the second input/output pad I/O_2.

When the first to fourth fuses 111_1 to 111_4 are severed, the first to fourth signal bonding pads 130_1 to 130_4 may be electrically connected to only the second protection section 112_1, the fourth protection section 112_2, the sixth protection section 112_3, and the eighth protection section 112_4, respectively. For example, when the first and third fuses 111_1 and 111_3 are severed, the second protection section 112_1 and the sixth protection section 112_3 may be electrically connected to the first input/output pad I/O_1. Also, when the second and fourth fuses 111_2 and 111_4 are severed, the fourth protection section 112_2 and the eighth protection section 112_4 may be electrically connected to the second input/output pad I/O_2. For example, when the first to fourth fuses 111_1 to 111_4 are severed, the input/output capacitance of the first and second input/output pads I/O_1 and I/O_2 may be reduced. When the first and third fuses 111_1 and 111_3 are severed, the input/output capacitance of the first input/output pad I/O_1 may be reduced. When the second and fourth fuses 111_2 and 111_4 are severed, the input/output capacitance of the second input/output pad I/O_2 may be reduced. Whether the internal circuit es protected by a surge voltage generated from the outside when the first to fourth fuses 111_1 to 111_4 are severed will be described with reference to FIG. 11.

Figure 11:
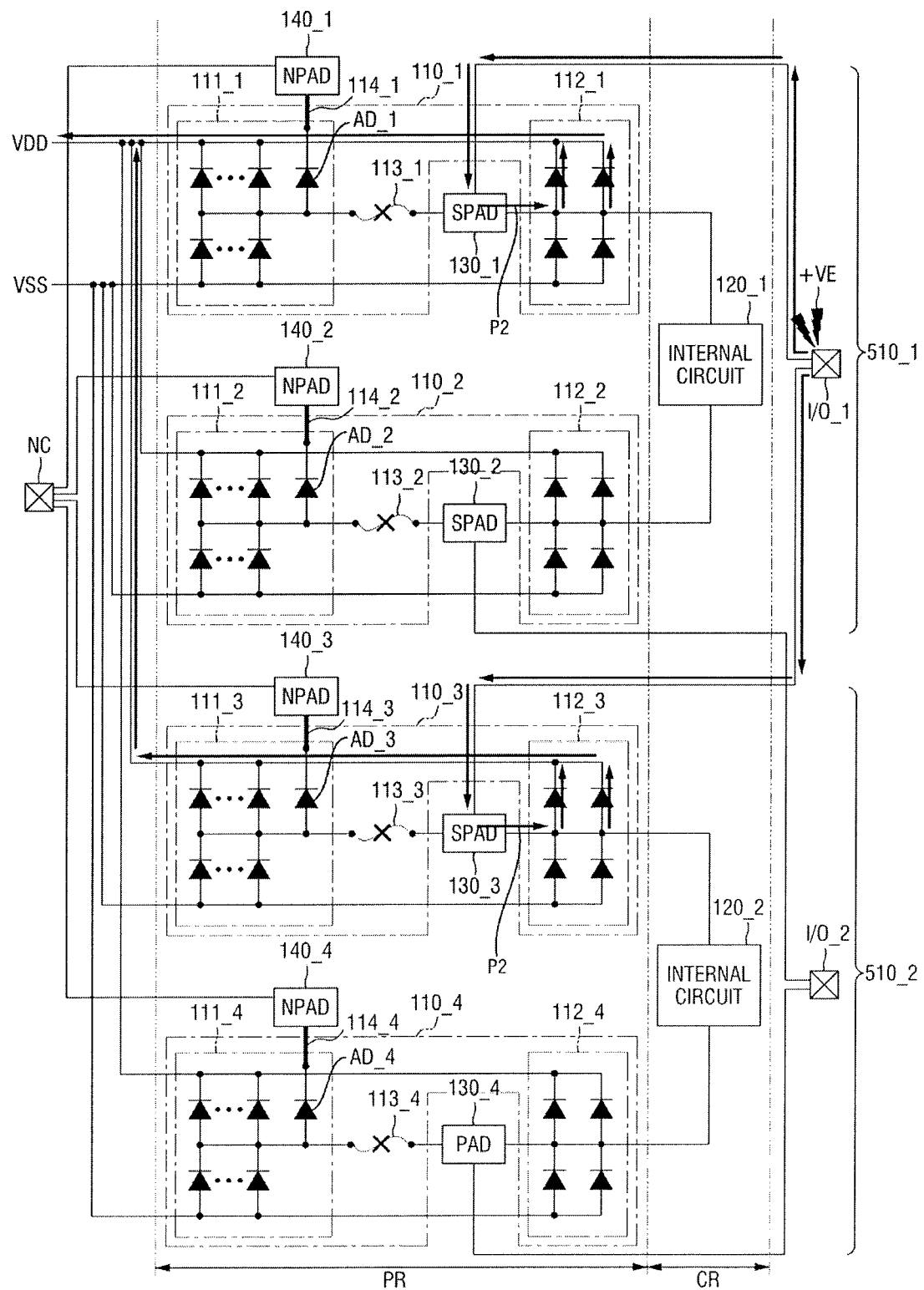
FIG. 11 illustrates an exemplary diagram for explaining a current path when a surge voltage is applied to the semiconductor package according to some embodiments.

FIG. 11 illustrates an exemplary diagram for explaining a current path when a surge voltage is applied to the semiconductor package according to some embodiments. FIG. 11 illustrates the case where a positive surge voltage (+VE) is applied to the first input/output pad I/O_1.

Referring to FIG. 11, when a positive surge voltage (+VE) is applied to the first input/output pad I/O_1, the current may flow to the first voltage line (VDD) through the first signal bonding pad 130_1 and the second protection section 112_1. Also, when the positive surge voltage (+VE) is applied to the first input/output pad I/O_1, the current may flow to the first voltage line (VDD) through the third signal bonding pad 130_3 and the sixth protection section 112_3.

For example, as described above, the first and third signal bonding pads 130_1 and 130_3 may be electrically connected to the first input/output pad I/O_1. Therefore, the second and sixth protection sections 112_1 and 112_3 connected to each of the first and third signal bonding pads 130_1 and 130_3 may also be electrically connected to the first input/output pad I/O_1. When the surge voltage is applied to the first input/output pad I/O_1, it may be possible to prevent the current generated by the surge voltage from flowing into the second internal circuits 120_1 and 120_2, using the first and second protection sections 112_1 and 112_3.

The semiconductor package 700 according to some embodiments may have a relatively small input/output capacitance. Accordingly, when the first to fourth fuses 113_1 to 113_4 are severed, the operating speed of the semiconductor package 700 may be fast. Further, even if the first to fourth fuses 113_1 to 113_4 were to be severed, the semiconductor package 700 according to some embodiments may prevent the first and second internal circuits 120_2 from being destroyed by the surge voltage generated from the outside. According to some embodiments, it may be possible to provide the semiconductor package 700 in which both reliability and the operating speed are ensured.

Figure 12:
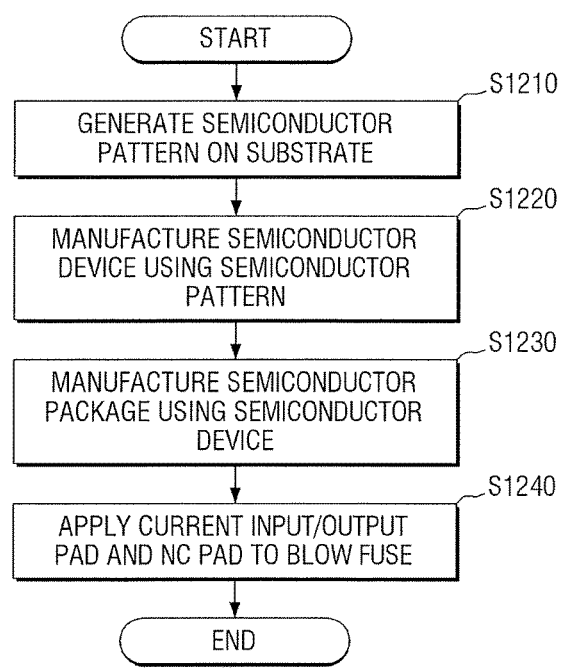
FIG. 12 illustrates an exemplary flowchart for explaining a method of manufacturing a semiconductor package according to some embodiments.

FIG. 12 illustrates an exemplary flowchart for explaining a method of manufacturing a semiconductor package according to some embodiments.

Referring to FIGS. 1, 2, 5, 7 and 12, the semiconductor pattern 220 may be formed on the substrate 210 (S1210). The semiconductor pattern 220 may include an electric static discharge protection circuit 100.

The semiconductor device 510 may be manufactured using the semiconductor pattern 220 (S1220). For example, the semiconductor pattern 220 formed on the substrate 210 along the scribe lane 230 may be separated, and the semiconductor device 510 may be manufactured using a packaging process or the like. The electric static discharge protection circuit 100 included in the semiconductor pattern 220 may prevent a surge voltage, such as may be generated, for example, in a process of transferring the substrate 210, separating the semiconductor pattern 220, or the like, from destroying the internal circuit 120.

The semiconductor package 700 may be manufactured to include a plurality of semiconductor devices 510 (S1230).

For example, the semiconductor package 700 may be manufactured, by mounting the first and second semiconductor devices 510_1 and 510_2 on the package substrate 710. The electric static discharge protection circuit 100 included in the semiconductor device 510 may prevent a surge voltage from destroying the internal circuit 120. For example, the first to eighth protection sections 111_1 to 112_4 may prevent a surge voltage, such as may be generated in the process of transferring the semiconductor device 510 or mounting the semiconductor device 510 on the package substrate 710, from destroying the first and second internal circuits 120_1 and 120_2.

After fabricating the semiconductor package 700 including the plurality of semiconductor devices 510, current may be applied to the input/output pad and the NC pad to blow the fuse included in the semiconductor package 700 (S1240). For example, the first and third fuses 113_1 and 113_3 may be severed by, for example, connecting a probe supplying the current source 910 to the first input/output pad I/O_1 and the NC pad (NC). Further, the second and fourth fuses 113_2 and 113_4 may be severed by, for example, connecting a probe supplying the current source 910 to the second input/output pad I/O_2 and the NC pad (NC). The semiconductor package 700 in which the fuse included therein is severed may prevent the surge voltage from destroying the internal circuit. Accordingly, the semiconductor package may be highly reliable, have a small input capacitance, and have a relatively high operating speed.

According to some embodiments, it may be possible to prevent destruction of the internal circuit 120 due to a surge voltage during the manufacturing procedure of the semiconductor package 700. In addition, it may be possible to provide a semiconductor package 700 with ensured reliability and performance by severing the fuse 113 after manufacturing the semiconductor package 700.

Figure 13:
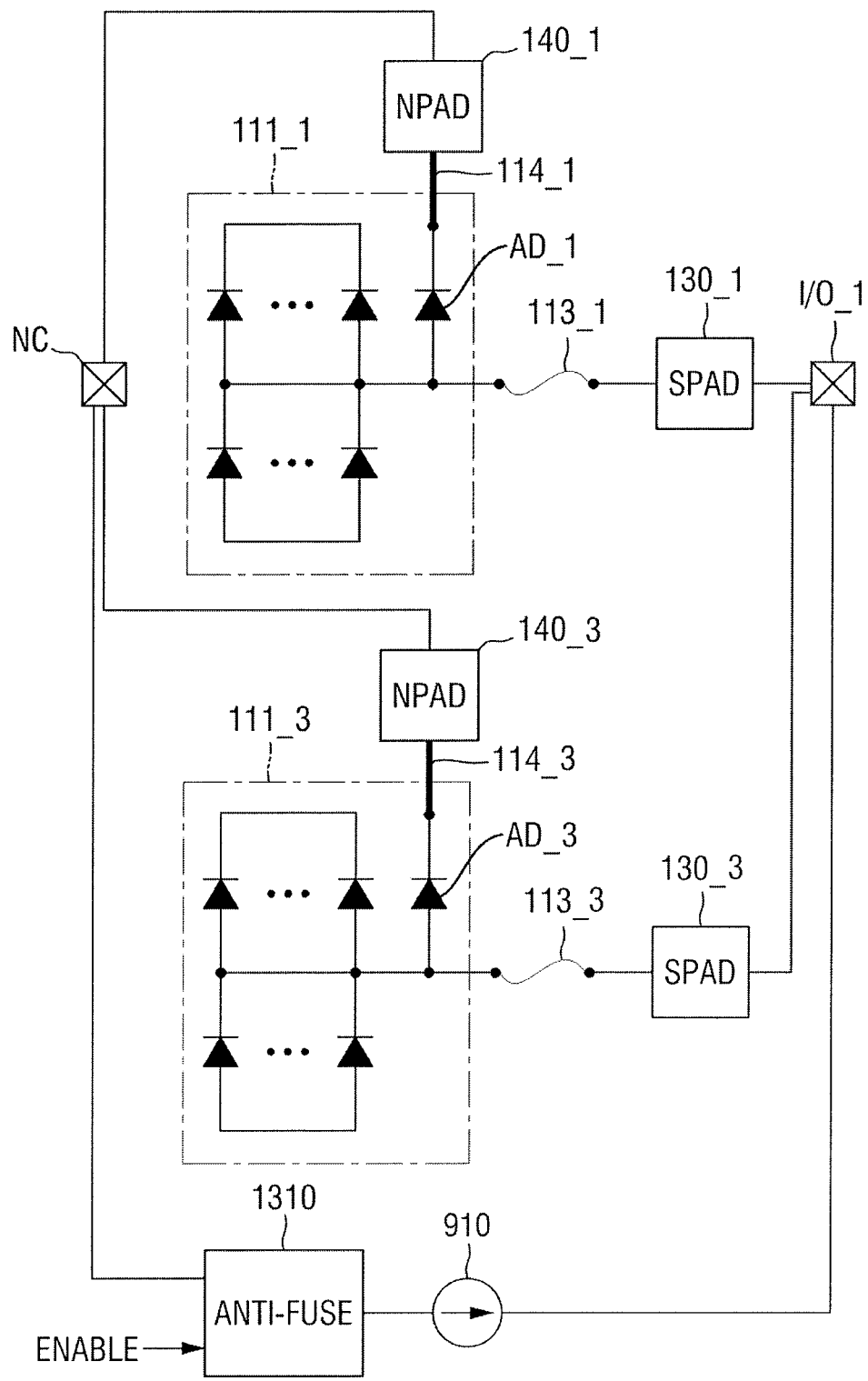
FIG. 13 illustrates an exemplary diagram for explaining a procedure of severing the fuse according to some other embodiments.

FIG. 13 illustrates an exemplary diagram for explaining a procedure of severing the fuses according to some other embodiments.

The semiconductor package 700 according to some embodiments may be provided by removing the fuses in various ways Referring to FIG. 13, when the first and third fuses 113_1 and 113_3 are removed, an anti-fuse 1310 may be used. The anti-fuse 1310 may be provided between the paths through which the melting current flows. For example, the anti-fuse 1310 may electrically connect the paths through which the melting current flows by a signal (EN-ABLE) from the outside, and may sever the first and third fuses 113_1 and 113_3.

By way of summation and review, embodiments provide a semiconductor device including an electric static discharge protection circuit and a semiconductor package including the same.

When an ESD (Electric Static Discharging) protection circuit is used in a semiconductor device to prevent damage due to an electrostatic discharge, for example, an ESD, the size of a protection circuit may be increased in order to fundamentally improve the ESD protection characteristics. However, when the size of the ESD protection circuit in the semiconductor device increases, the input/output capacitance also increases and the operating speed of the semiconductor device decreases. For example, there is a trade-off relation between the performance and reliability of semiconductor devices.

Embodiments provide a semiconductor device with ensured reliability.

Embodiments provide a semiconductor package with ensured reliability and better performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A semiconductor device, comprising:
   an internal circuit in a core region;
   a first protection circuit in a peripheral region separate from the core region, the first protection circuit including a first protection section, a second protection section, and a first fuse;
   a first pad configured to receive a first signal; and
   a second pad electrically connected to the first protection section, the second pad being electrically connected to the first fuse through a first connection line and a fusing diode in series,
   wherein:
   the first pad is electrically connected to the first protection section via the first fuse, and the first pad is electrically connected to the internal circuit via the second protection section,
   and
   when a surge voltage having a magnitude equal to or larger than a predetermined voltage is input to the first pad, each of the first and second protection sections prevent the surge voltage from being applied into the internal circuit.

2. The semiconductor device as claimed in claim 1, wherein:
   the first protection section includes:
      a first diode having an anode electrically connected to a first node and a cathode electrically connected to a first voltage line to which a first voltage is applied, and
      a second diode having a cathode electrically connected to the first node and an anode electrically connected to a second voltage line to which a second voltage different from the first voltage is applied, and
   the second protection section includes:
      a third diode having an anode electrically connected to a third node and a cathode electrically connected to the first voltage line, and
      a fourth diode having a cathode electrically connected to the third node and an anode electrically connected to the second voltage line.

3. The semiconductor device as claimed in claim 2, wherein:
   the first fuse is electrically connected to the first node and a second node, and the first pad is electrically connected to the second node and the third node.

4. The semiconductor device as claimed in claim 3, wherein the internal circuit is electrically connected to the third node.

5. The semiconductor device as claimed in claim 2, wherein:
   the first protection section includes a plurality of the first diode and the second diode, the second protection section includes one or more of the third diode and the fourth diode, and
a number of the plurality of first and second diodes included in the first protection section is larger than a number of the one or more third and fourth diodes included in the second protection section.

6. The semiconductor device as claimed in claim 5, wherein:
the fusing diode has an anode electrically connected to the first node, and
the first connection line is electrically connected to the second pad and a cathode of the fusing diode.

7. The semiconductor device as claimed in claim 1, wherein a width of the first connection line is larger than a width of the first fuse.

8. The semiconductor device as claimed in claim 1, further comprising:
a second protection circuit in the peripheral region and including a third protection section, a fourth protection section, and a second fuse; and
a third pad receiving a second signal and being different from the first pad,
wherein the third pad is electrically connected to the third protection section via the second fuse, and the third pad is electrically connected to the fourth protection section,
the internal circuit is electrically connected to the third pad through the fourth protection section, and
when the surge voltage is input to the third pad, each of the third and fourth protection sections form third and fourth current paths through which the surge voltage is discharged to prevent the surge voltage from applying into the internal circuit.

9. A semiconductor package, comprising:
a first semiconductor device that includes a first pad receiving a first signal, a first protection section electrically connected to the first pad through a first fuse, a second protection section connected to the first pad, a second pad electrically connected to the first protection section, and a first internal circuit electrically connected to the first pad through the first protection section;
a circuit board on which the first semiconductor device is mounted;
a first input/output pad on the circuit board and electrically connected to the first pad; and
a probing pad on the circuit board and electrically connected to the second pad,
wherein the first fuse is electrically insulated when a melting current equal to or greater than a predetermined current is input between the first input/output pad and the probing pad.

10. The semiconductor package as claimed in claim 9, further comprising:
a second semiconductor device that includes a third pad receiving a first signal, the third pad being different from the first pad, a third protection section electrically connected to the third pad through a second fuse, a fourth protection section connected to the third pad, a fourth pad electrically connected to the third pad, and a second internal circuit electrically connected to the third pad though the third protection section,
wherein the third pad is electrically connected to the first input/output pad, and the fourth pad is electrically connected to the probing pad, and the second fuse is electrically insulated when the melting current is input between the first input/output pad and the probing pad.

11. The semiconductor package as claimed in claim 10, wherein the first semiconductor device further includes a fifth pad to receive a third signal, the fifth pad being different from the first and third pads, a fifth protection section electrically connected to the fifth pad through a third fuse, a sixth protection section connected to the fifth pad, and a sixth pad electrically connected to the fifth protection section,
the fifth pad is electrically connected to a second input/output pad different from the first input/output pad, and the sixth pad is connected to the probing pad, and
the third fuse is electrically insulated when the melting current is input between the second input/output pad and the probing pad.

12. The semiconductor package as claimed in claim 9, wherein the second pad is electrically connected to the first protection section through a first connection line, and
a width of the first connection line is greater than a width of the first fuse.

13. The semiconductor package as claimed in claim 9, wherein:
the first protection section includes a plurality of first diodes that each have an anode electrically connected to a first node and a cathode electrically connected to a first voltage line to which a first voltage is applied, and a plurality of second diodes that each have a cathode electrically connected to the first node and an anode electrically connected to a second voltage line to which a second voltage different from the first voltage is applied,
the second protection section includes one or more third diodes that each have an anode electrically connected to a third node and a cathode electrically connected to the first voltage line, and one or more fourth diodes that each have a cathode electrically connected to the third node and an anode electrically connected to the second voltage line, and
a number of the plurality of first and second diodes is greater than a number of third and fourth diodes.

14. The semiconductor package as claimed in claim 13, wherein:
the second pad is electrically connected to the first protection section through a first connection line,
the first protection section further includes a fusing diode having an anode electrically connected to the first node, and
the first connection line is electrically connected to the second pad and a cathode of the fusing diode.

15. A semiconductor device, comprising:
a first fuse connected to a first node and a second node;
a first pad, which is electrically connected to the second node and a third node and to which a first signal is input from the outside;
a first diode, which has an anode electrically connected to the first node, and a cathode electrically connected to a first voltage line to which a first voltage is applied;
a second diode, which has a cathode electrically connected to the first node, and an anode electrically connected to a second voltage line to which a second voltage different from the first voltage is applied;
a third diode, which has an anode electrically connected to the third node, and a cathode electrically connected to the first voltage line;

a fourth diode, which has a cathode electrically connected to the third node, and an anode electrically connected to the second voltage line;

a fusing diode having an anode electrically connected to the first node; and a second pad electrically connected to a cathode of the fusing diode by a first connection line, wherein a width of the first connection line is greater than a width of the first fuse.

16. The semiconductor device as claimed in claim 15, wherein, when a first surge voltage equal to or higher than a predetermined positive voltage level is applied to the first pad, a first current path through which a current is supplied from the first pad to the first voltage line through the first diode is formed, and a second current path through which a current is supplied from the first pad to the first voltage line through the third diode is formed.

17. The semiconductor device as claimed in claim 16, wherein a first heat generated in the first diode by the first current path is greater than a second heat generated in the third diode by the second current path.

18. The semiconductor device as claimed in claim 15, wherein, when a second surge voltage less than a predetermined negative voltage level is applied to the first pad, a first current path through which a current is supplied from the first pad to the second voltage line through the second diode is formed, and a second current path through which a current is supplied from the first pad to the second voltage line through the fourth diode is formed.

19. The semiconductor device as claimed in claim 18, wherein a first heat generated in the second diode by the first current path is greater than a second heat generated in the fourth diode by the second current path.

* * * * *